(12) United States Patent
Seitz (10) Patent No.: US 8,179,119 B2
(45) Date of Patent: May 15, 2012

(54) CHARGE SAMPLING DEVICE AND METHOD

(75) Inventor: Peter Seitz, Urdrof (CH)

(73) Assignee: CSEM Centre Suisse d'Electronique et de Microtechnique SA, Neuchatal (CH)

( * ) Notice: Subject to any disclaimer, the term of this patent is extended or adjusted under 35 U.S.C. 154(b) by 387 days.

(21) Appl. No.: 12/611,044

(22) Filed: Nov. 2, 2009

(65) Prior Publication Data

US 2010/0109640 A1    May 6, 2010

(30) Foreign Application Priority Data

Oct. 31, 2008  (EP) ..................................... 08168070

(51) Int. Cl.
*G01R 13/34* (2006.01)
*G01N 27/60* (2006.01)
(52) U.S. Cl. ..................................... 324/76.38; 324/452
(58) Field of Classification Search ............... 324/76.38, 324/452
See application file for complete search history.

(56) References Cited

U.S. PATENT DOCUMENTS

| 4,168,444 A | | 9/1979 | van Santen |
| 4,393,357 A | * | 7/1983 | Linnenbrink et al. ........ 333/165 |
| 4,725,748 A | | 2/1988 | Hayes |
| 5,528,643 A | | 6/1996 | Hynecek |

FOREIGN PATENT DOCUMENTS

| EP | 0540105 A2 | 9/1993 |
| EP | 1624490 | 2/2006 |

OTHER PUBLICATIONS

Hoffman, Kurt. "Surface Charge Transport With An MOS-Transmission-Line." Solid State Electronics, 1977, vol. 20, pp. 177-181. Pergamon Press, printed in Great Britain.

* cited by examiner

*Primary Examiner* — Amy He
(74) *Attorney, Agent, or Firm* — Morriss O'Bryant Compagni, P.C.

(57) ABSTRACT

The invention relates to the sampling of temporally changing amounts of charge (102) by receiving varying amounts of charge (102) varying as a function of time, transforming the varying amounts of charge received into a linear distribution pattern, sampling the linear distribution pattern at a plurality of discretely spaced sampling locations (104), and collecting the amounts of charge (102) located between two adjacent scanning locations, and further detecting the collected amounts of charges (102). A temporal sampling device for time-varying analog signals encompasses a transducer (100) in which the analog signals are converted into a corresponding electrical current, a time conversion element (103) in which the electronic charge packets (102) composing the current signal are transported in an electric field along a one-dimensional path, a fast charge-storing and accumulation mechanism with which the charge packets (102) on the one-dimensional path of the time conversion element (103) can all be stored simultaneously, so that their spatial relationship is retained, and a charge detection circuit (109) with which the stored charge packets (102) can be accessed individually and read out with an electronic circuit. In a preferred embodiment, all elements of the sampling device are monolithically integrated using a semiconductor process such as a commercially available CMOS process based on silicon. This makes it possible to provide one- and two-dimensional arrays of such sampling devices, forming line and image sensors.

16 Claims, 7 Drawing Sheets

CHARGE SAMPLING DEVICE AND METHOD

CROSS-REFERENCE TO RELATED APPLICATION

This application claims priority to EP08168070.4 filed on Oct. 31, 2008, the entirety of each of which is incorporated by this reference.

FIELD OF THE INVENTION

This invention relates generally to devices and methods for the temporal sampling of time-varying signals. More specifically, it relates to the temporal sampling of time-varying analog signals, e.g. of signals representing physical quantities such as the intensity of electromagnetic radiation, the pressure of sound waves, the mechanical displacement of objects, or electrical signals such as voltage or current.

The invention relates, in particular, to devices and methods for the sampling of such signals that are changing very rapidly, on a time-scale measured in nanoseconds or below. It further relates to devices and methods for detection of complete trains of charge packets.

The invention further relates to a method of producing such a device, specifically devices for the sampling of electromagnetic radiation fields, whose conversion into current signals can be achieved efficiently with the semiconductor material used for the signal processing devices themselves.

Even more precisely, the invention relates to a signal processing device and a sampling device comprising a signal emitter and a signal processing device for sampling of time-varying amounts of charge emitted by the signal emitter. The invention further relates to a signal sampler, in which a plurality of such sampling devices is arranged on one substrate in a one- or two-dimensional pattern, forming a line or image sensor. The invention further relates to signal samplers with sampling devices having transducers sensing electromagnetic radiation fields, whose conversion into current signals can be achieved efficiently with the same semiconductor material also used for the realization of the signal processing devices themselves.

BACKGROUND OF THE INVENTION

The temporal characterization of time-varying signals is a problem occurring often in science and technology. Instruments and apparatus capable of sampling analog signals are called waveform analyzers, transient recorders, digital oscilloscopes, data loggers, etc. The typical operation of such an instrument consists of the time-sequential conversion of the analog signal into a train of digital values which are then stored for later retrieval and analysis. This operation is limited by the speed with which analog signals can be sampled and converted into the corresponding digital representation.

To increase the sampling speed to very high values measured in nanoseconds and below, the analog signal is sampled at very high speed, and the acquired samples are represented by electrical charge packets that are stored in a suitable charge storage element, such as a charge coupled device (CCD). From this CCD, the charge packets can then be read out and converted into a train of corresponding digital values at reduced speed, requiring only limited analog-to-digital conversion rates.

An example of such a fast-in/slow-out (FISO) sampling device is described in U.S. Pat. No. 4,725,748 (R. Hayes et al., "High-speed data acquisition using multiple charge transfer delay lines"). It employs a linear CCD structure through which the signal charge packets are clocked at high speed. To both sides of this CCD line, two-dimensional CCD storage sections are placed which are tapping the high-speed CCD line at various spatial positions, and thus sampling the signal charge packets at various times. The two-dimensional CCD sections allow for intermediate storage of the signal charge packets and for reading them out through a common output node at reduced speed. This device requires clocking of the complete CCD line and charge signal sampling at the full sampling frequency, requiring complex, high-performance electronic driving circuitry.

The demands on this driving circuitry can be reduced with a suitable charge signal demultiplexer, requiring less complex and slower clocking circuitry, as taught in European Patent No. 0540105A2 (J. H. Noordeloos et al., "Sampling device for sampling analog signals and digital measuring instrument provided with such a sampling device"). Similar two-dimensional CCD storage and FISO readout structures with a common single output node are employed as described in U.S. Pat. No. 4,725,748. Although the complexity of the clocking circuitry is reduced, it is still necessary to provide a clock with the maximum sampling frequency to the demultiplexing structure, and the two-dimensional CCD charge storage and FISO structures require a substantial amount of space on the sampling device.

To simplify charge transport in the demultiplexing structure, a combined transport method using electrical drift in clocked charge coupled delay lines was invented in U.S. Pat. No. 5,528,643 (J. Hynecek, "Charge coupled device/charge super sweep image system and method for making"). This method allows the fast transport of charge packets in semiconductors, increasing the readout speed of CCD image sensors. However, the method only works for single charge packets, and it is therefore unsuitable to sample analog time signals where the creation and detection of complete trains of charge packets are required.

A simpler method for moving electrical charge packets through semiconductor material was proposed by K. Hoffmann, in *Solid State Electronics*, Vol. 20, pp. 177-181 (1977). It allows the fast and almost lossless transport of charge packets at a speed that can be controlled with a voltage, without the need of any clock signals. This is achieved with an MOS (metal-oxide-semiconductor) transmission line, consisting of an elongated layer of highly resistive material on top of an insulator covering a semiconductor. A voltage difference is applied to the two ends of the highly resistive layer, creating a spatially varying potential distribution at the interface between semiconductor and insulator. Charges packets that are introduced through a transistor into the semiconductor transmission line feel the spatially varying surface potential, and they move along the electric field lines to the region with lowest potential energy, at the other end of the transmission line. As a consequence, this device allows the fast and almost lossless transport of charge carriers along the length of the semiconductor device. However, since this transmission line is intended only as a charge transport device, it does not provide any means for the temporal sampling of the charge signals, other than the conventional charge detection circuits which could be placed at the end of the transmission line.

To overcome the limitations of these known methods and devices, the present invention describes a temporal sampling device for time-varying analog signals, allowing the sampling of one-time signals as well as the sampling and accumulation of recurring signals with very high temporal resolution below one nanosecond.

SUMMARY OF THE INVENTION

It is a principle of the invention to provide a temporal sampling device for fast time-varying signals, specifically analog signals, allowing the precise time sampling with very high temporal resolution below one nanosecond.

A further principle of the invention is to provide a temporal sampling device for recurring, fast time-varying analog signals, allowing the synchronized sampling and accumulation with a very high temporal resolution below one nanosecond.

Another principle of the invention is to provide a temporal sampling device for analog signals whose readout is implemented with known electronic circuitry, allowing for the sensitive readout of the stored charge signals exhibiting charge noise of about one electron at room temperature.

Yet another principle of the invention is to provide a fabrication method with which the device according to the invention can be fabricated monolithically using industry-standard semiconductor processes.

A further principle of the invention is to provide a device for the fast temporal sampling of analog signals that are spatially varying in one and two dimensions, thus allowing the realization of "temporal waveform analyzer image sensors".

With the foregoing principles in view, the present invention is achieved with a device according to the claims.

A signal processing device according to the invention comprises a linear time conversion element, means for producing a lateral electrical field in the linear time conversion element for sweeping charge on the linear time conversion element in the direction from a first end to a second end along a longitudinal extension of the linear time conversion element, and a plurality of storage and accumulation units arranged in at least one row along the longitudinal extension of the time conversion element. The device further comprises means for electrically connecting and disconnecting the storage and accumulation units to the time conversion element at a plurality of discretely spaced sampling locations. Further there is provided at least one input area for entering charge into the signal processing device and at least one charge detecting circuit electrically connectable to the storage accumulation units for detecting charge having passed at least a part of the linear time conversion element.

The signal processing device according to an embodiment of the invention has the input area on the first end of the linear time conversion element for receiving a temporal signal on a first end of the time conversion element. In this case, the device serves to sample the temporal signal, which is a varying amount of charge varying as a function of time In another embodiment of the signal processing device, a plurality of input areas are connectable to the storage and accumulation devices and the at least one charge detecting circuit is connected to the second end of the linear time conversion element in a manner that the charges are passed from the input area to the storage and accumulation devices and from there via the linear time conversion element to the charge detecting circuit. This kind of device serves mainly for producing a quasi analog signal based on digital information.

In an even further embodiment of the signal processing device the input area is located on the first end of the linear time conversion element, the charge detecting circuit is connected to the second end of the linear time conversion element and means are present either to change the electrical field between sampling the charges and moving the charges stored in the storage and accumulation units to the linear time conversion element, and/or to move the charges stored in the storage and accumulation units in a temporally staggered manner to the linear time conversion element. Such device may serve for stretching or compressing a signal.

An exemplary embodiment of the device is making use of an input stage in which the analog signal is converted into a corresponding time-varying electrical current. This current signal is fed into a time conversion stage in which the electronic charge carriers composing the current signal are transported in an electric field along a one-dimensional straight or curved path. On this path, the temporal analog input signal is represented by a travelling spatial distribution of charge carriers, where the local charge carrier density is monotonically related to the analog signal's temporal amplitude. This travelling charge density pattern can be sampled simultaneously along the complete one-dimensional path with a fast charge-transfer, storage and accumulation mechanism, completely retaining the charge density patterns spatial relationship. In a readout stage, which is either implemented individually for each charge storage element or jointly for all charge storage elements, the stored charge packets can be accessed sequentially and read out with high sensitivity using a known electronic circuit.

In another embodiment of the present invention, all components of the sampling device are monolithically integrated using a commercially available semiconductor process based on silicon. This is of particular practical interest for a photo-signal sampling device, in which the input stage consists of a semiconductor region converting the incident, temporally changing light intensity into a corresponding photo-current, which is electrically fed into the linear time conversion element of the device.

The signal processing device according to this embodiment of the invention comprises:

1) A linear time conversion element (having a longitudinal extension between a first end and a second end),
2) On a first end of the time conversion element
   2a) either an input area for receiving a temporal signal
   2b) or a signal emitter, e.g. a transducer, emitting a temporal signal,
   the temporal signal being a varying amount of charge varying as a function of time,
3) Means for producing a lateral electrical field in the time conversion element sweeping the varying amounts of charge received along the longitudinal extension of the linear time conversion element,
4) A plurality of storage and accumulation units arranged in at least one row along one or two sides of the linear time conversion element,
5) Means for electrically connecting and disconnecting the storage and accumulation units to the time conversion element at a plurality of discretely spaced sampling locations,
6) At least one charge detection circuit connectable to the storage and accumulation units for handling the charges stored in the storage and accumulation units.

In the linear time conversion element the received amounts of charge move along its longitudinal extension with a given speed. The charges in the linear time conversion element are distributed along its longitudinal extension in relation to the time passed after the receipt of the charges. Therefore, the sampling locations of the storage and accumulation units have a time impact. The amounts of charges collected by the storage and accumulation units relate to a specific time period of receipt of amounts of charges on the first end of the linear time conversion element. The storage and accumulation units may be electrically connected to the linear time conversion element for a specific time, eventually also shorter than necessary for collecting the charges in the conversion element between the specific storage and accumulation unit and its adjacent neighbor storage and accumulation unit. The collection time may be, as far as possible, the identical time period for all the accumulation units. The collection time periods may also be temporally staggered for different storage and accumulation units. By such a device a higher frequency signal may be analyzed by a lower frequency device.

The signal processing device according to the invention may be operated in two directions. A first direction is, as described above, sampling received amounts of charges in storage and accumulation units. A second direction is feeding sampled amounts of charge stored in the storage and accumulation units into the longitudinal time conversion element. With this second direction of use, a time varying signal may be produced by first filling the individual storage and accumulation units with specific amounts of charge and afterwards feeding these amounts on the discretely spaced sampling locations into the longitudinal time conversion element. The feeding may be done with all storage and accumulation units at the quasi same point of time or, again, in a temporally staggered way. The filling of the storage and accumulation units may be carried out one after the other. In this way, a higher frequency signal may be analyzed with a lower frequency device.

With such a signal processing device the storage and accumulation units are advantageously arranged in more than one row along one or two sides of the time conversion element. In this way, the distance between the sampling locations may be shortened compared to a device having the storage and accumulation units only on one side. The storage and accumulation unit may be built laterally on both sides of the layers of conversion element, but also underneath and/or on top of the layers of the conversion element.

The sampling locations are arranged in equidistant relation to each other. For specific use, the locations may be arranged in groups. The sampling locations or the groups of sampling locations can be arranged in different distances from each other. The distances may—just as an illustration—be doubled each time going from one to the adjacent sampling location. The sampling locations may be arranged e.g. in a logarithmic pattern, and so on. For any specific application a particular arrangement is designable.

Areas of the time conversion element, within which the amount of charge is accumulated within one storage and accumulation unit, may be of identical length, even when the distances between sampling locations differ. This can be achieved by arranging connection points between two sampling locations, where charge may be removed from the time conversion element without being accumulated in a storage and accumulation unit. This has the advantage that the amounts collected in the different storage and accumulations devices are related to a certain, identical length of time period, although the time interval corresponding to the different sampling locations is changing.

For the design of a semiconductor chip carrying such a signal processing device, different forms of the longitudinal time conversion element and different arrangements of the storage and accumulation units each have specific advantages and disadvantages. For certain designs at least a part of the longitudinal extension of the time conversion element extends along a straight line. The straight line design has the advantage that the distances between the sampling locations can easily be configured to be equidistant. A curved line configuration has the advantage of being more concentrated on a small spot, e.g. around a sensor means. A zigzag line has the advantage that a long and small longitudinal extension can be reduced to a shorter and wider extension of the linear time conversion element. For the reasons of optimization of space and shortening the distance between two adjacent sampling locations the sampling locations and the storage and accumulation units are arranged on the convex side of a curve of the line.

In most applications there must be a transducer arranged on one end of the time conversion element. The transducer feeds a signal, in the typical case it is an analog signal, to the conversions section. The transducer, as it was connected in the state of the art with a plurality of storage and accumulation units, is connected not only to one, but to two or more time conversion elements. This allows feeding one time conversion element after the other and, hence, provides time for the sampling of the amounts of charge and the detecting of the sampled amounts of charge.

For detection of the stored amounts of charge in the plurality of storage and accumulation units, several possible arrangements of one or a plurality of charge detection circuits is possible. Depending on the desired possibilities for detection, there may be a plurality of storage and accumulation units electrically connected to one single common electronic charge detection circuit. Alternatively, an electronic charge detection circuit can be arranged on the second end of the time conversion element, opposite to the input area or the signal emitter. Further, a group of storage and accumulation units may be electrically connected to a common electronic charge detection circuit. Further again, each or some single storage and accumulation units may be connected to its own electronic charge detection circuit.

A signal processing device as described above allows the sampling of temporally changing amounts of charge by the following steps:
1) receiving varying amounts of charge, which are varying as a function of time,
2) transforming the time varying amounts of charge into a linearly distributed charge pattern,
3) sampling the linear distribution pattern at a plurality of discretely spaced sampling locations, and collecting the amounts of charge located between two adjacent scanning locations, and
4) electronically detecting the collected amounts of charges (102).

The above steps can be specified more precisely as follows:
1) receiving varying amounts of charge on one end of a linear time conversion element having a longitudinal extension, the amount of charge varying as a function of time, while
2) producing a lateral electrical field in the time conversion element, thereby sweeping the varying amounts of charge received along the longitudinal extension of the time conversion element,
3) connecting a plurality of accumulation units arranged in at least one row along the longitudinal extension of the time conversion element to the time conversion element at a plurality of discretely spaced sampling locations, and thereby collecting the amounts of charges on the time conversion element between two adjacent sampling locations in one of the storage and accumulation units, and finally
4) transporting the charges accumulated in the storage and accumulation units to at least one electronic charge detection circuit for the subsequent detecting of the charges accumulated in the storage and accumulation units.

With this method the signal processing device serves to either detect and process a fast input signal at a much slower frequency or to generate a fast output signal on the basis of a much slower input and activation frequency. The maximum sampling frequency f of the input signal is given by the velocity v of the charge carriers in the time conversion element divided by the minimum spatial separation S between two sampling locations: $f=v/S$. As a practical example, consider a minimum spatial separation of $S=5$ µm and a velocity of $v=50,000$ m/s; this would result in a maximum sampling frequency of f=10 GHz. Assuming the frequency for connecting and disconnecting the storage and accumulation units to and from the time conversion element on the sampling locations is 0.5 GHz (that is every 2 nanoseconds), with 20 sampling locations on the time conversion element you would achieve the above-mentioned 10 GHz sampling frequency f with a 20 times slower control-frequency.

The sampling frequency f is given by v/S (v=velocity of charge transport, S=sampling location pitch). If you have n storage and accumulation units, the control frequency F would be smaller or equal to v/S/n. Therefore the control frequency F can be much smaller than the sampling frequency: After the sampling process, it is possible to wait for arbitrary times—for example until an external trigger signal is received—before the next sampling process takes place.

The transport velocity v of the charge on the time conversion element is definable by the lateral electrical field produced in the linear time conversion element. A high electrical field produces a high transport speed, a low electrical field produces a low transport speed. This can be used to compress or to stretch an analog signal. For stretching of the signal the signal is fed to the linear time conversion element while producing a high electrical field. Then the charges moving with high speed on the linear time conversion element are sampled at a common point of time in the plurality of storage and accumulation units. Afterwards the electrical field is lowered. Now the charges in the storage and accumulation units are moved at a common point of time to the linear time conversion element. Now the signal on the time conversion element is stretched. The same is true in the other direction. By first producing a lower and then, after sampling, a higher electrical field the signal can be compressed.

The method includes the step of electrically detecting the amounts of charge accumulated in one storage and accumulation unit after the amounts of charge were accumulated in an adjacent accumulation unit. This step is necessary, when one single electronic charge detection circuit is arranged on the second end of the time conversion element serving a plurality of storage and accumulation units. However it may be applied also in other cases. The charges may be disposed on the time conversion element and fed from the time conversion element to an electronic charge detection circuit. They may be placed on a second time conversion element arranged on the other side of the storage and accumulation units than the first time conversion element and fed from this second time conversion element to an electronic charge detection circuit.

The charges can be moved from the storage and accumulation unit directly to an electronic charge detection circuit. In one and the same sampling device they can be moved either directly to the electronic charge detection circuit or to the first or second time conversion element and via this time conversion element to the charge detection circuit. A further possibility is that the sampling device has, as well, charge detecting devices connected directly to the storage and accumulation units and a further charge detecting circuit connected to the time conversion element; the charges stored in the storage and accumulation units may be moved, according to a choice to be made, either via the time conversion element to this last-mentioned charge detection circuit or to the charge detection circuits connected directly to the storage and accumulation units. The charges accumulated in a plurality of storage and accumulation units can be moved into a plurality of electronic charge detection circuits or successively into a common electronic charge detection circuit. One signal processing device may have areas, where a plurality of storage and accumulation units are electrically connected to a plurality of electronic charge detection circuits and areas where a plurality of storage and accumulation units are connected to a common electronic charge detection circuit.

Although the charges may, under certain circumstances, be collected in a temporally staggered manner in one storage and accumulation unit after the other with a time difference to be chosen, the charges are collected simultaneously (or quasi simultaneously) in a plurality of storage and accumulation units.

In most applications the charges are moved into the time conversion element. Although the charges stored in the storage and accumulation units along a time conversion element may be moved one after the other into the time conversion element, in some applications they may be moved simultaneously into said or a second time conversion element for producing a charge pattern running along said or the second time conversion element.

These signal processing devices with a specific arrangement of time conversion elements and a plurality of storage and accumulation units arranged along the side of the linear time conversion element and electrically connected to it by means able to connect and disconnect them, are in most applications present in a pattern of multiple signal processing devices and transducers forming together a signal sampler. Therefore, the invention relates also to a signal sampler with on one and the same wafer-substrate a plurality of sampling devices, each sampling device encompassing at least one transducer emitting varying amounts of charge corresponding to physical quantities, and at least one signal processing device as described above. The sampling devices may for some applications be arranged in a one-dimensional pattern, forming a line, for other applications they may be arranged in a two-dimensional pattern, forming an image sensor.

The present invention is further directed to a method of producing a signal processing device. Such method comprises the steps of:
a) providing a linear time conversion element with an input area for receiving a temporal signal on a first end of the time conversion element,
b) providing means for producing a lateral electrical field in the time conversion element,
c) arranging a plurality of storage and accumulation units in at least one row on one or two sides of the linear time conversion element,
d) providing means for electrically connecting and disconnecting the accumulation units to the time conversion element at a plurality of discretely spaced sampling locations, and
e) providing at least one charge detection circuit electrically connectable to the storage and accumulation units.

Advantageously the method comprises the step of arranging a signal emitter, e.g. transducer, on the first end of the time conversion element.

The method encompasses the creating of at least one time conversion element, a plurality of storage and accumulation units and at least one charge detection circuit as a semiconductor structure on a wafer-substrate. Furthermore it may encompass the creation of a transducer as part of the semiconductor structure on the wafer-substrate.

DETAILED DESCRIPTION

Figure 1:
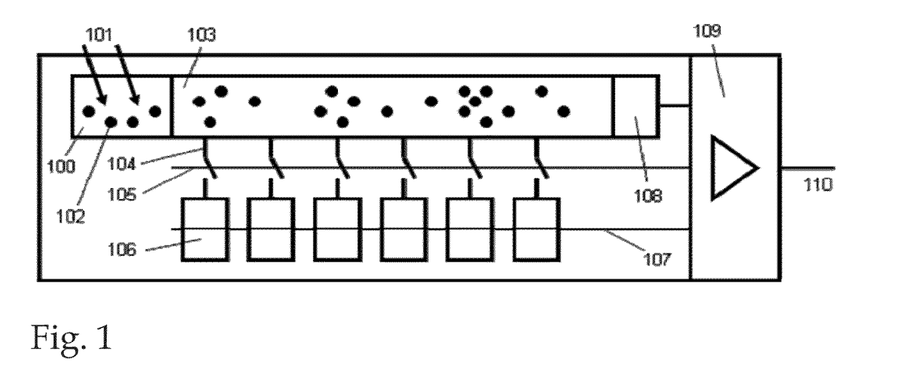
FIG. 1 is a schematic illustration of the principle of a signal processing device according to the present invention.

With reference to FIG. 1, the principle of a signal sampling device according to the present invention is shown on a schematic drawing of an analog signal processing device. This analog signal processing device has of a transducer 100, in which the magnitude of a physical parameter 101 such as temperature; pressure, electromagnetic radiation, particle irradiation, etc. is converted monotonically into a corresponding amount of charge 102. Such transducers are described, for example, by J. Fraden, "Handbook of Modern Sensors: Physics, Designs and Applications", Springer, Berlin (2004), and they include Seebeck elements (transduction of temperature), charge balances (transduction of force and pressure), photodiodes or charge-coupled devices (transduction of electromagnetic radiation) and ionization chambers (transduction of ionizing and particle radiation).

Connected to the transducer 100 is a single time conversion element 103 having a longitudinal extension between the transducer 100 on a first end and a second end, here a decoupling section 108. The signal charge 102 may be varying rapidly as a function of time, with a bandwidth in the range of 1 MHz to 1 THz. The task of the subsequent time conversion element 103 is to convert the temporal signal into a spatial signal. This is performed by the time conversion element 103 being a linear device, sweeping the signal charge, which has been produced by the transducer 100, along the time conversion element 103 by means of a lateral electrical field in the time conversion element. This has the effect of producing a spatial charge density pattern, corresponding to the temporal variation of the physical parameter to be measured, which is travelling along the time conversion element 103.

The time conversion element 103 is electrically decoupled from a charge detection circuit, charge handling section or charge disposal section 109 through a decoupling section 108, so that the operation of the charge detection circuit 109 does not influence the electrical field distribution in the time conversion element 103.

The time conversion element 103 is laterally connected to a multitude of storage and accumulation units 106 for charge sampling, storing and accumulation unit accumulating charge packets. This is realized with electrical switches 104 which are arranged very closely to the time conversion element 103, so that the travelling spatial charge density pattern can be sampled quickly and effectively by moving the charge packets adjacent to the switches 104 into the storage and accumulation units 106. This sampling process occurs under the control of a signal line 105 which controls all switches 104 quasi simultaneously. According to signal processing theory, as described for example in A. V. Oppenheim and R. W. Schafer, "Digital Signal Processing", Prentice Hall Inc., Englewood Cliffs, N.J. (1975), the sampling time and sampling period realized by the switches 104 must be shorter than half the inverse bandwidth of the signal, the so-called Nyquist limit. If the signal is repetitive, this sampling process can be effectuated repeatedly and synchronously with the signal, so that the charge packets stored in the storage and accumulation units 106 are accumulated, resulting in a larger signal level for the subsequent electronic detection of this signal charge.

Once sampling, storage and accumulation has terminated, the stored charge packets in the storage and accumulation units 106 are read out individually, using one or several electronic charge detection circuits 109. These charge detection circuits produce electrical charge, current or voltage signals which are provided to subsequent electronic circuits through one or several electric output lines 110.

Geometrical spacing of the switches 104 and the charge accumulation units 106 along the time conversion element 103 poses a limit to the temporal sampling resolution that can be obtained with the signal sampling device according to this invention: If the charge carriers move with the speed v, a lateral distance d between charge sampling devices limits the time sampling resolution T to T=d/v. As an example of sampling times that can be obtained in practice, consider a spacing of d=1 μm and a charge carrier velocity of v=105 m/s, corresponding to the saturation velocity of electrons and holes in silicon, as described for example in S. M. Sze, "Semiconductor Devices—Physics and Technology", John Wiley and Sons Inc., New York (1985). The resulting time sampling resolution is T=10 ps.

Figure 2:
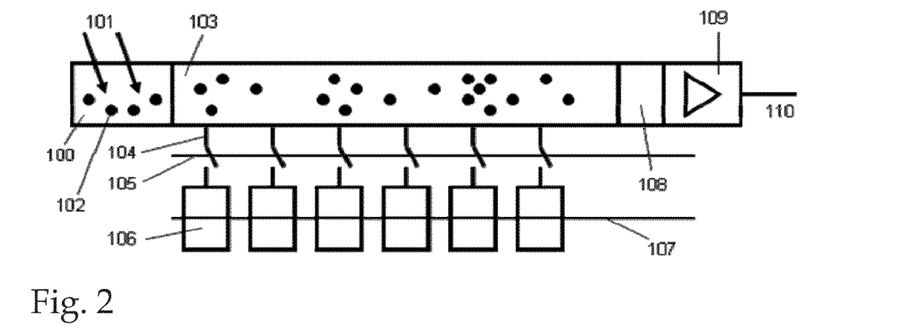
FIG. 2 is a schematic illustration of an embodiment of a signal processing device according the invention. In this embodiment, only one or a few output amplifiers are provided for the whole device, with which the sampled and accumulated charge signals are converted into corresponding voltages.

Referring to FIG. 2, an embodiment of the signal sampling device according to the present invention consists of a multitude of storage and accumulation units 106, all placed on one side of the time conversion element 103. Electronic readout of the charge packets stored in the individual storage and accumulation units 106 is realized with one single charge detection circuit 109 at the end of the time conversion element 103, electrically decoupled with the decoupling section 108. Suitable electronic charge detection circuits, such as source followers or Miller integrators are described for example in A. S. Sedra and K. C. Smith, "Microelectronic Circuits", 3rd edition, Oxford University Press Inc., New York (1991).

Figure 3:
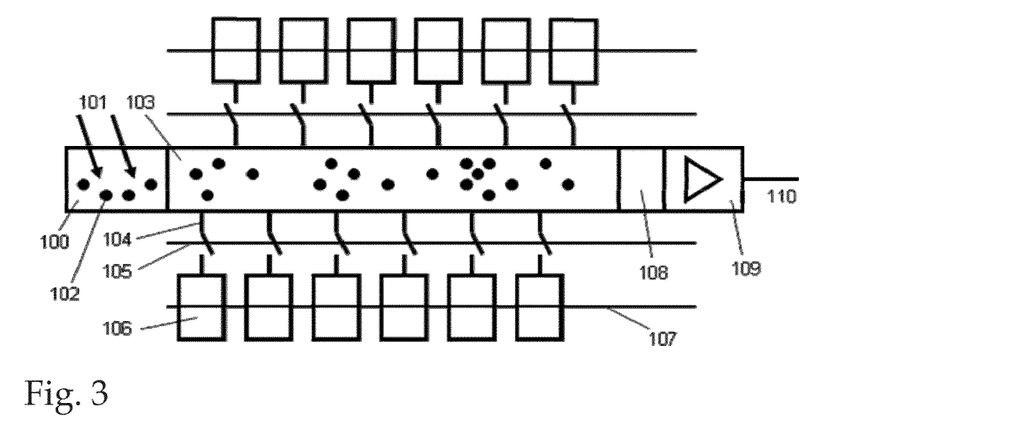
FIG. 3 is a schematic illustration of yet another embodiment of a signal processing device according to the invention, in which subsystems for charge sampling, accumulation and storage are arranged on both sides of the linear time conversion element of the device.

Referring to FIG. 3, another embodiment of the signal sampling device arranges the storage and accumulation units 106 on both sides of the time conversion element 103. This allows the doubling of the density of scanning locations, that is a doubling of the switches 104 and of the storage and accumulation units in comparison with the embodiment shown in FIG. 2, and, as a consequence, it reduces the time sampling resolution T by half.

Figure 4:
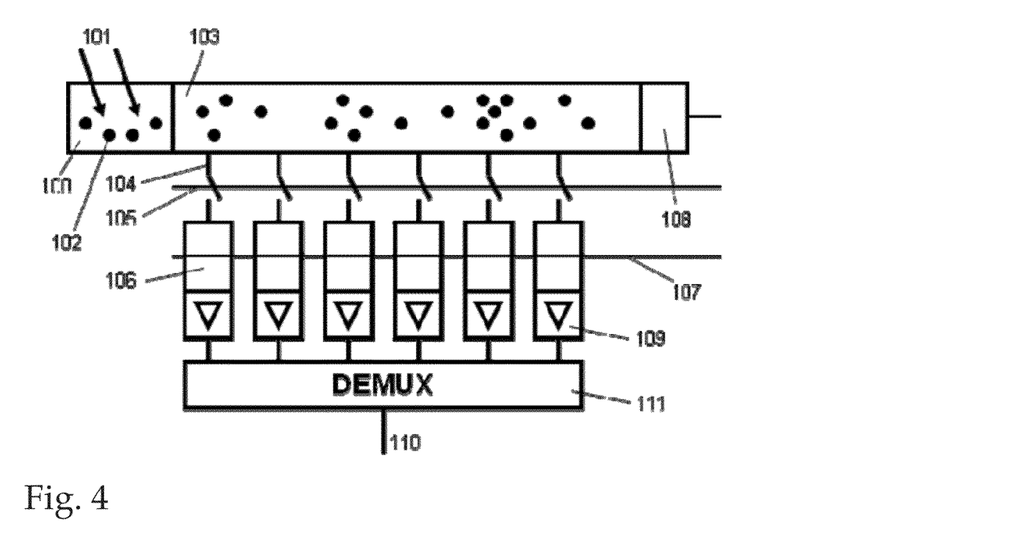
FIG. 4 is a schematic illustration of an alternative embodiment of a signal processing device according to the invention. Each charge storage and accumulation unit of the signal processing device is provided with its own output amplifier, with which the sampled and accumulated charge signals are converted into corresponding voltages.

Referring to FIG. 4, another embodiment of the signal sampling device arranges the storage and accumulation units 106 on one of the time conversion element 103. The following is also true if the storage and accumulation units are, departing from FIG. 4, arranged on both sides of the time conversion element 103. Each of the storage and accumulation units 106 is provided with its own electronic charge detection circuit 109 for the electronic readout of the stored charges. The resulting signals are provided at one or several electric output lines 110, which are connected through a demultiplexing circuit 111 and the charge detection circuits 109 to the storage and accumulation units 106.

Figure 5:
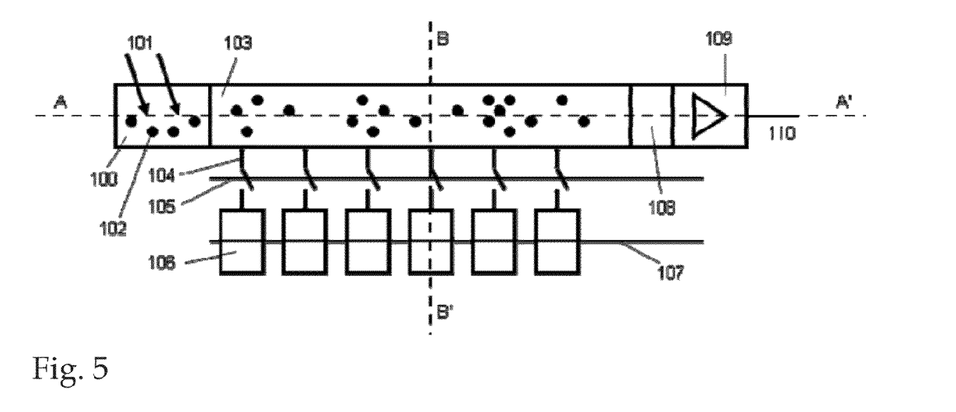
FIG. 5 shows the same embodiment of the signal processing device illustrated in FIG. 2. Cross sections through this signal processing device along the lines A-A' and B-B' are shown in the FIGS. 6 and 7.
Figure 6:
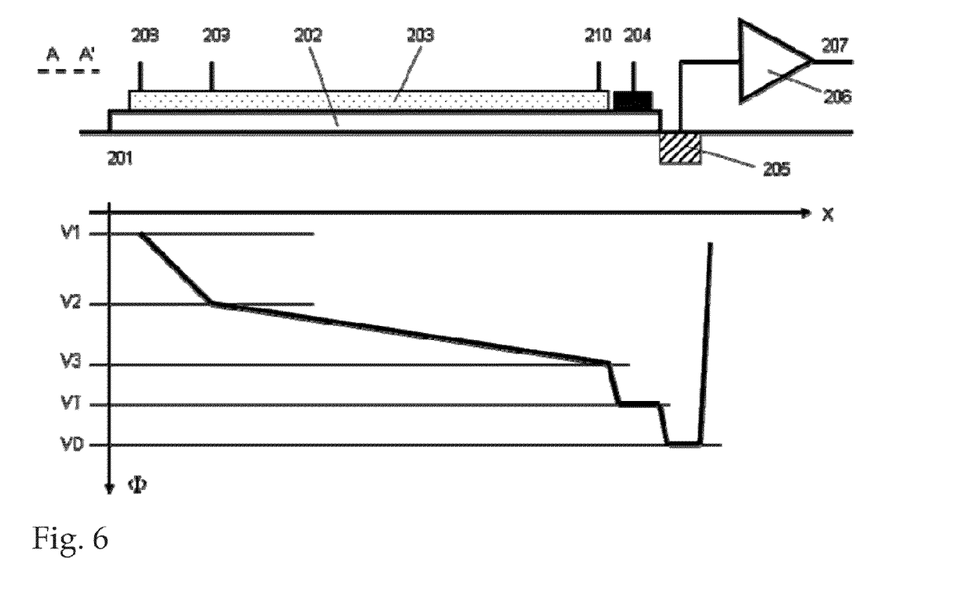
FIG. 6 shows in its upper part a cross section through the signal processing device illustrated in FIG. 5 along the line A-A'. In the lower part, the potential distribution at the semiconductor-insulator interface 201-202 is illustrated.

With reference to FIGS. 5 and 6, an embodiment of the signal transduction section or signal transducer 100 and the time conversion element 103 along the line A-A' consists of a semiconductor substrate 201, such as silicon, covered with an insulating layer 202 with a thickness of 1-5000 nm, for example silicon-dioxide. On top of the insulator 202, a high-resistivity electrode 203 is fabricated, with a sheet resistance greater than 10Ω/square. The high-resistivity electrode is contacted at one end 208 (FIG. 6, section A-A') and supplied with a voltage V1, and at the other end 210 the high-resistivity electrode is contacted and supplied with a voltage V3. If electrons are transported in the time conversion element 103, then V1 must be lower than V3. If holes are moved in the time conversion element 103, then V1 must be higher than V3. Between these two contacts 208 and 210, a third contact 209 is provided where a voltage V2 is supplied. This voltage V2 lies between the voltages V1 and V3. In this embodiment of the signal sampling device, the semiconductor volume lying between the electrodes 208 and 209 is acting as the signal transduction section 100. The semiconductor volume lying between the electrodes 209 and 210 is acting as the linear time conversion element 103. Incident electromagnetic radiation or particles of sufficient energy, essentially larger than the bandgap of the semiconductor, produce electron-hole pairs, and one type of charge carriers is attracted to the semiconductor-insulator interface.

Without loss of generality, we are assuming in the following that $0<V1<V2$, so that the attracted charge carriers are electrons. The lower part of FIG. 6 illustrates the lateral potential distribution along the line A-A' at the semiconductor-insulator interface. The currents flowing in the high-resistivity electrode are producing a spatially dependent voltage increase which is essentially reproduced at the semiconductor-insulator interface. As a consequence, the photo-generated electrons move from the transduction section 100 to the right, past the electrode 209, into the linear time conversion element 103. There, the photo-generated electron density pattern is moving towards the electrode 210. If the high-resistivity material is homogeneous, the voltage increase in the signal transduction and the linear time conversion element 103 is linear, as illustrated in the lower part of FIG. 6. Therefore, the electrons are moving with constant speed towards the electrode 210, and the speed is given by the product of the mobility in the semiconductor times the magnitude of the lateral electric field. In order to protect the linear time conversion element 103 from incident radiation, it may be covered with an additional layer that is opaque to the incident radiation. The signal transduction section 100, however, must be exposed the incident radiation, and care must be taken that the overlying materials are of sufficient transparency to the radiation to be detected. As an alternative, the radiation to be detected could also be impinging from the back side, i.e. from below in FIG. 6. The linear time conversion element 103 is electrically decoupled from the output stage with a decoupling section 108 (FIG. 5), specifically a transfer gate 204 (FIG. 6) to which a voltage VT is supplied, resulting in a voltage VD≅VT under the transfer gate which must be larger than V3. The electrons can be read out with one of two methods known in literature, either with a floating diffusion or with a floating gate. In FIG. 6, a floating diffusion is shown, whose reset voltage VD must be higher than VT. Therefore, the electrons arriving from the linear time conversion element are collected in the diffusion 205, from where they can either be drained, or they can be measured with the electronic charge detection circuit 206 (corresponding to 109 in FIG. 5), delivering the measurement result on the output line 207 (corresponding to 110 in FIG. 5).

Figure 7:
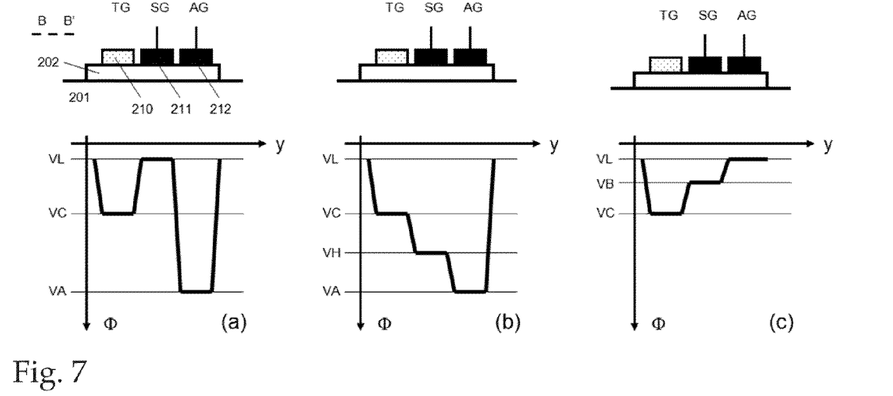
FIG. 7 shows a cross section through the signal processing device illustrated in FIG. 5 along the line B-B', as well as the potential distribution at the semiconductor-insulator interface 201-202 for three different times during an acquisition process: (a) The one-dimensional charge pattern is travelling undisturbed under the time conversion element (transport gate 203, TG). (b) The one-dimensional charge pattern is sampled, by transferring the charge packets simultaneously under all sampling gates 211 (SG) to the storage and accumulation unit (accumulation gates 212, AG). (c) For each of the sampling gates individually, the stored charge packet is transferred back under the transport gate 203.

With reference to FIGS. 5 and 7, an embodiment of the storage and accumulation units 106 is shown in a sectional view along the line B-B'. The sectional view shows an insulator layer 202 on top of the semiconductor substrate 201. The sampling switch 104 is realized as a sampling gate 211 on each scanning location on top of the insulator and adjacent to the high-resistivity electrode 203 (FIG. 6), and the storage and accumulation unit 106 is realized as a gate 212 on the insulator. All the sampling gates 211 corresponding to the switches 104 in FIG. 5 are connected with the sampling line 105 (FIG. 5), and the voltage on the sampling line is used to control the sampling process. In the lower part of FIG. 7, the potential distribution at the semiconductor-insulator interface along line B-B' is illustrated for three different phases. FIG. 7(a) shows the condition when the photo-generated electrons are moving along the linear time conversion element 103 (transport gate TG in FIG. 7) undisturbed, since the voltage VL under the sampling gate 211 (SG) is lower than the voltage VC under the high-resistivity electrode (TG). During this time, the voltage at the storage electrode 212 (accumulation gate AG) is kept high, so that electrons that might have already been accumulated there are not flowing back into the time-conversion element TG. Charge density sampling initiated when the voltage at the sampling gate 211 is switched instantaneously to a voltage VH which must lie between the voltage VC under the high-resistivity electrode 203 (TG) and the voltage VA under the storage/accumulation electrode 212 (AG). This causes the charges in the time-conversion element (TG) to flow under the accumulation electrode 212, where they are stored.

Readout of the charge packets stored in the storage and accumulation units 106, 212 or AG is performed by first switching the common sampling gate 211 to an intermediate voltage VB for all storage and accumulation units 106, 212, AG, where VL<VB<VC. After that, each individual storage and accumulation unit is emptied individually into the linear time conversion element 103 (high-resistivity electrode 203), by switching the storage gate 212 to a low voltage VL. The stored charge packet is moved under the linear time conversion element 103, 203, TG to the output diffusion 205, where it is measured by the charge detection circuit 206 (FIG. 6). After this measurement, the output diffusion 205 is reset for a next measurement, and the voltage on the storage gate 212 is increased to a value VA which is larger than VB, so that the charge storage device is again electrically isolated from the linear time conversion element 103.

Figure 8:
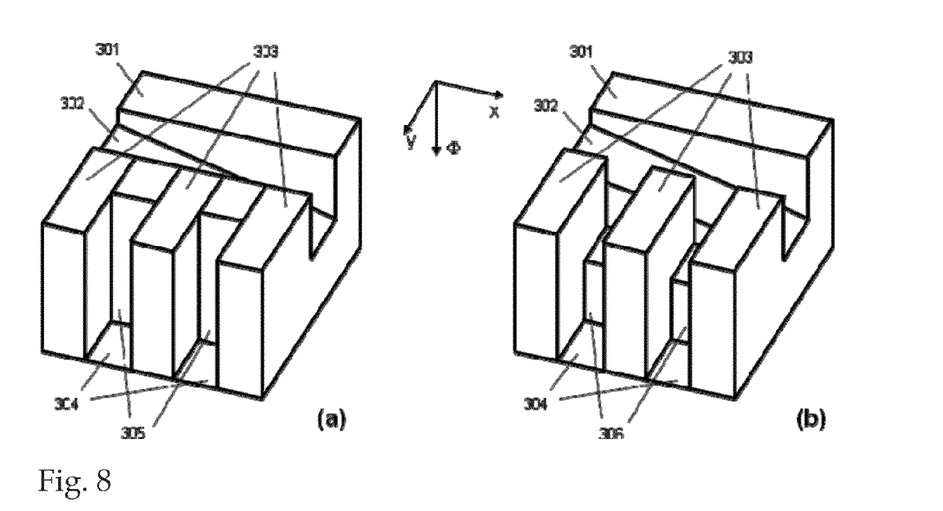
FIG. 8 is a schematic illustration of the potential distribution at the surface of the semiconductor 201. (a) The one-dimensional charge pattern is moving down the potential slope 302, created under the transport gate 203; this corresponds to the situation illustrated in FIG. 7a. (b) The one-dimensional charge pattern is sampled, by transferring the charge packets through the lowered potential step 306 under the sampling gate 211 (SG) to the potential minimum 304 under the accumulation gate 212 (AG).

The operation of this embodiment is clarified with FIG. 8; showing a three-dimensional illustration of the potential distribution (vertical axis), as a function of the lateral coordinate along A-A' (direction x) and the transverse direction along B-B' (direction y). FIG. 8(a) illustrates the condition for the unimpeded flow of the photo-generated charge carrier density pattern down the potential slope 302 of the time conversion element. Charges are confined to the linear time conversion element by a lower potential 301 in the surrounding environment of the linear time conversion element, under the sampling gates with potential 305, and in the region between the sampling gates with potential 303. FIG. 8(b) illustrates the condition when sampling takes place: The potential under all the sampling gates is increased simultaneously to a potential 306 which is higher in all places than the potential slope 302 under the linear time conversion element. Since the potential 304 under the storage gates is higher than the potential 306 under the sampling gates, the charge packets moving down the potential slope 302 in the linear time conversion element that are close to the corresponding sampling gates with potential 305 are moving under the associated storage gate having a potential 304.

Figure 9:
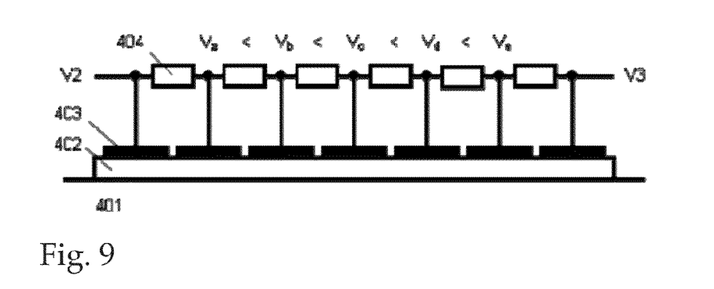
FIG. 9 is a schematic illustration of an alternative embodiment of the transport gate configuration for the generation of the potential slope. When applying the two voltages V2<V3 to a chain of resistors 404, a monotonously increasing series of voltages Va<Vb,<...<Vn is produced, which is applied to the electrodes 403 on top of the insulator 402. As a result, a monotonously increasing potential distribution at the semiconductor-insulator interface 401-402 is generated, with which the charge pattern is transported towards the right of the figure.

Referring to FIG. 9, an alternative embodiment of the linear time conversion element consists of an insulating layer 402 on top of the semiconductor substrate 401. Closely spaced individual electrodes 403 are produced on the insulator, and these electrodes are electrically connected to a chain of resistors 404. The two ends of this chain are kept at constant voltages V2 and V3 for the generation of a current through the resistor chain. Assuming that V2<V3 for the transport of electrons, as described above, this current is producing a series of voltages Va<Vb< . . . <Ve, which are present at the electrodes 403. Since these voltages are essentially reproduced under the insulator, a staircase-like potential profile is generated at the semiconductor-insulator interface, which is moving the electrons to the right of FIG. 9.

The embodiments of the linear time conversion element illustrated in FIGS. 6 and 9 make use of an electrical current for the generation of a spatially dependent potential profile at the semiconductor-insulator interface. For this reason, electrical power is dissipated, leading to increased power consumption and heating of the device. This can be avoided with an alternative embodiment of the linear time conversion element illustrated in FIG. 10. This embodiment makes use of the fact that a voltage applied to an electrode on an insulator on top of a semiconductor produces a potential at the semiconductor-insulator interfaces which is slightly lower than the voltage on the electrode. The thicker the insulator 502 the larger is the voltage drop across it. The embodiment in FIG. 10 exploits this fact by providing an insulator 502 whose thickness is varying monotonously along the linear time conversion element. An extended electrode 503 is fabricated on top of the complete variable-thickness insulator 502, and a single voltage V is supplied to the electrode. As a consequence, the potential at the semiconductor-insulator interface is closer to V at the end with a thinner insulator, and it is farther removed from V at the end with a thicker insulator. As an example, if electrons should be transported to the right in FIG. 10, a positive voltage V should be applied to the electrode, and the variable-thickness insulator should be thinner at the right-hand end.

Figure 10:
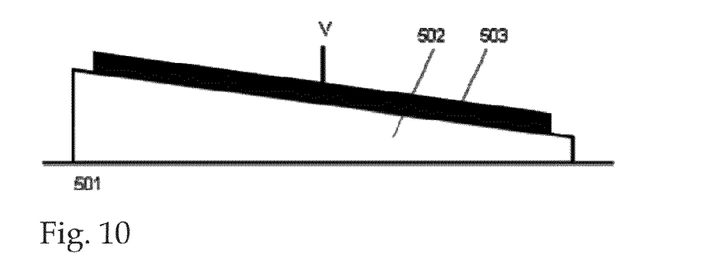
FIG. 10 is schematic illustration of yet another alternative embodiment of the transport gate configuration for the generation of the potential slope. When applying the single voltage V at the elongated electrode 503 on top of the insulator 502 with spatially decreasing thickness as a function of lateral position, a monotonously increasing potential distribution at the semiconductor-insulator interface 501-502 is generated, with which the charge pattern is transported towards the right of the figure.
Figure 11:
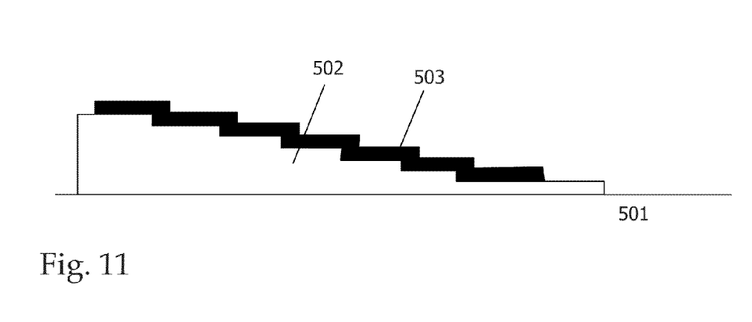
FIG. 11 is a schematic illustration of a further alternative embodiment of the transport gate configuration for the generation of stepwise potential distribution along the longitudinal extension of the elongated electrode 503 serving as time conversion element 103.

A combination of the features of the time conversion elements according to the FIGS. 9 and 10 is achieved, if the thickness of the insulator 502 is varying stepwise along the time conversion element, as it is shown in FIG. 11.

Figure 12:
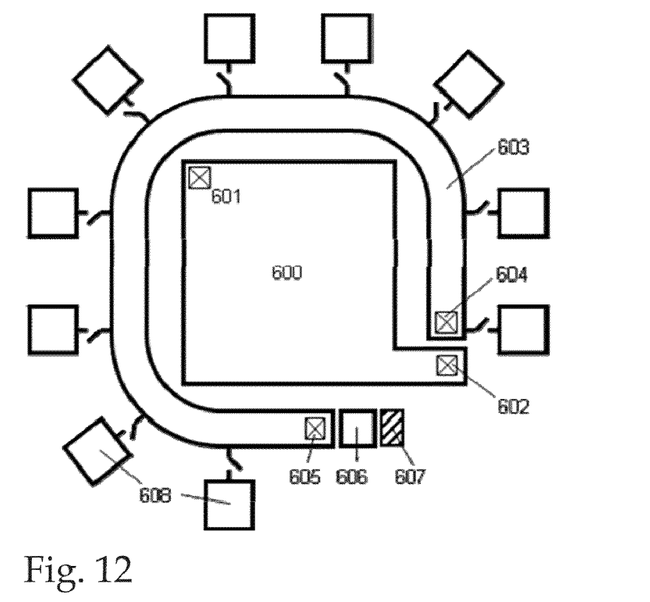
FIG. 12 is a schematic illustration of an embodiment of the time conversion element or transport gate as a curved, linear structure 603 around the signal transduction region 600.

The linear time conversion element represents a linear path for the transport of the charge carriers, and its length is much larger than its width. It is not necessary, however, that the linear time conversion element must be straight; it can be realized also with a curved geometry. Referring to FIG. 12, this is achieved, for example, by surrounding a rectangular signal transducer device 600 with a coiled linear time conversion element 603. One embodiment uses a high-resistivity layer on an insulator and two electrodes 601 and 602 for the generation of a lateral electric field, driving the charge carriers under the electrode 602. The linear time conversion element 603 is also realized with a high-resistivity layer on top of an insulator, and the electric field is generated with the two electrodes 604 and 605. Since the signal transducer device and the linear time conversion element are capacitively coupled in this embodiment, an appropriate voltage difference must be present between the electrodes 602 and 604, so that the signal charges move from the signal transducer device to the linear time conversion element. Similar to the embodiment illustrated in FIG. 6, the linear time conversion element 604 is decoupled from the detection diffusion 607 with a transfer gate 606. The charge storage and accumulation units 608 are arranged along the linear time conversion element, e.g., on its outer side for a compact realization.

Figure 13:
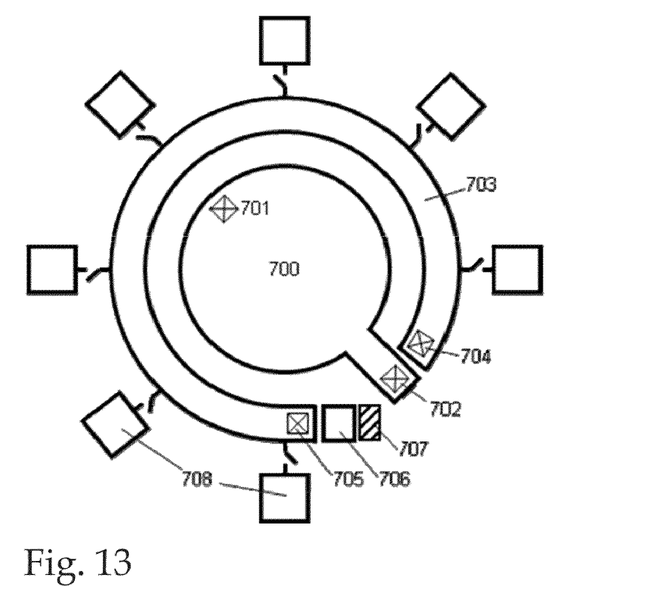
FIG. 13 is a schematic illustration of an embodiment of the time conversion element or transport gate as a circular segment 703 around a circular signal transduction region 700.

With reference to FIG. 13, an alternative embodiment of a curved linear time conversion element consists of a circular segment 703 around a circular signal transducer device 700. As in FIG. 12, another embodiment of the linear time conversion element uses a high-resistivity layer on an insulator and two electrodes 701 and 702 for the generation of a lateral electric field, driving the charge carriers under the electrode 702. The circular linear time conversion element 703 is also realized with a high-resistivity layer on top of an insulator, and the electric field along the linear time conversion element is generated with the two electrodes 704 and 705. As in the embodiment illustrated in FIG. 12, an appropriate voltage difference must be present between the electrodes 702 and 704, so that the signal charges move from the signal transducer device to the linear time conversion element. The linear time conversion element 704 is decoupled from the detection diffusion 707 with a transfer gate 706. The storage and accumulation units 708 are arranged circularly along the circular linear time conversion element. If a large number of storage and accumulation units are required, the linear time conversion element can be coiled several times in spiral shape around the signal transducer device 700.

Figure 14:
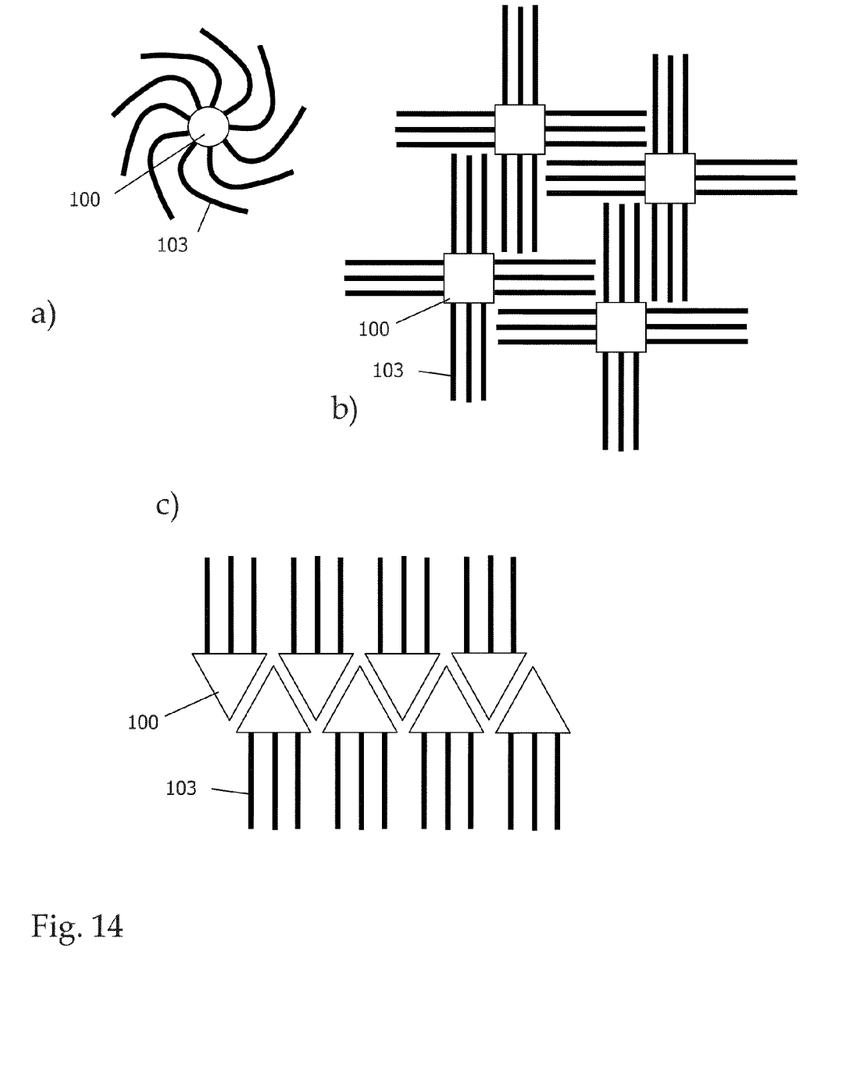
FIG. 14a is a schematic diagram of an embodiment of a single signal sampler.
FIG. 14b is a schematic diagram of an embodiment of a two-dimensional signal sampler.
FIG. 14c is a schematic diagram of an embodiment of a linear signal sampler.

Furthermore, the longitudinal extension of the time conversion element can be in a zigzag pattern. The patterns mentioned may be combined in any convenient manner, if desired. It is further possible to connect several time conversion elements 103 to a single and common transducer 100, as it is schematically shown in FIG. 14 for a single signal sampler in FIG. 14a, for a two-dimensional signal sampler in FIG. 14b and for a linear signal sampler in FIG. 14c. The multiple time conversion elements 103 are connected to the transducer 100 by switches not shown, connecting one time conversion element 13 after the other to the transducer 100.

The embodiments of the signal sampling device illustrated in FIGS. 6, 7, 9, 10, 11, 12, 13 and 14 employ a semiconductor-insulator interface for the transport of the signal charge carriers. As is known from charge-coupled devices (CCD), charge transport at a semiconductor-insulator interface is hampered by various surface effects. As a consequence, buried-channel CCDs with much better transport properties are realized, by the introduction of a lightly doped diffusion under the insulator, as described for example by A. J. P. Theuwissen, "Solid-state imaging with charge-coupled devices", Kluwer, Dordrecht (1995). Similarly, alternative embodiments of the analog signal sampling device according to the invention make use of the same techniques for improved transport properties in the signal transduction and the linear time conversion element.

Summarizing the present invention one can call it the sampling of changing amounts of charge (102) by receiving varying amounts of charge (102) varying as a function of time, transforming the varying amounts of charge received into a linear distribution pattern, sampling the linear charge distribution pattern at a plurality of discretely spaced sampling locations (104), and collecting the amounts of charge (102) located between two adjacent sampling locations, and processing the collected amounts of charges (102). This can be achieved by a temporal sampling device for time-varying analog signals having a transducer (100) in which the analog signals are converted into a corresponding electrical current, or a other signal emitter, a linear time conversion element (103) in which the electronic charge packets (102) composing the current signal are transported within a lateral electric field along a one-dimensional path, a fast charge-storing and accumulation mechanism (104, 106) with which the charge packets (102) on the one-dimensional path of the time conversion element (103) can all be sampled at a plurality of discretely spaced sampling locations and stored simultaneously in storage and accumulation units (106), so that their spatial relationship is retained, and a charge detection circuit (109) with which the stored charge packets (102) can be accessed individually and read out with an electronic charge detection circuit. In another embodiment, all elements of the sampling device are monolithically integrated using a semiconductor process such as a commercially available CMOS process based on silicon. This makes it possible to provide one- and two-dimensional arrays of such sampling devices, forming line and image sensors.

The invention claimed is:

1. A signal processing device comprising:
a linear time conversion element,
at least one electrical field generator for producing a lateral electrical field in the linear time conversion element for sweeping charge on the linear time conversion element in the direction from a first end to a second end along a longitudinal extension of the linear time conversion element,
a plurality of storage and accumulation units arranged in at least one row along the longitudinal extension of the time conversion element,
at least one electrically connecting and disconnecting device for connecting and disconnecting the storage and accumulation units to the time conversion element at a plurality of discretely spaced sampling locations, and
at least one input area for entering charge into the signal processing device and
at least one charge detecting circuit electrically connectable to the storage accumulation units for detecting charge having passed at least a part of the linear time conversion element.

2. The signal processing device according to claim 1, wherein the at least one input area is located on the first end of the linear time conversion element for receiving a temporal signal on a first end of the time conversion element, the temporal signal being a varying amount of charge varying as a function of time.

3. The signal processing device according to claim 1, wherein the at least one input area comprises a plurality of input areas connectable to the storage and accumulation units and the at least one charge detecting circuit is connected to the second end of the linear time conversion element in a manner that the charges are passed from the plurality of input areas to the storage and accumulation units and from there via the linear time conversion element to the charge detecting circuit.

4. The signal processing device according to claim 1, wherein at least one input area is located on the first end of the linear time conversion element, the charge detecting circuit is connected to the second end of the linear time conversion element.

5. A signal processing device according to claim 1, further comprising a plurality of areas of the time conversion element, the amount of charge within such plurality of areas is accumulated within one specific accumulation unit, each of which having identical length.

6. A signal processing device according to claim 1, further comprising a plurality of areas of the time conversion element, the amount of charge within such plurality of areas is accumulated within one specific accumulation unit, each of which having a different length.

7. A signal processing device according to claim 1, wherein the linear time conversion element has a curved part and the sampling locations are arranged on a convex side of the curved part.

8. A signal processing device according to claim 1, further comprising a signal emitter arranged on a first end of the time conversion element.

9. A signal processing device according to claim 8, wherein the signal emitter is connected to two or more time conversion elements.

10. The signal processing device according to claim 1, further comprising a signal sampler comprising a plurality of sampling devices, each encompassing at least one transducer emitting varying amounts of charge corresponding to physical quantities, and at least one signal processing device are arranged on one substrate.

11. A method of sampling changing amounts of charge comprising the steps of:
receiving varying amounts of charge varying as a function of time,
transforming the temporally varying amounts of charge received into a linear charge distribution pattern,
sampling the linear distribution pattern at a plurality of discretely spaced sampling locations, and collecting the amounts of charge between two adjacent sampling locations, and
detecting the collected amounts of charges.

12. The method of sampling changing amounts of charge according to claim 11, further comprising the steps of:
receiving the varying amounts of charge on one end of a linear time conversion element,
producing a lateral electrical field in the time conversion element, thereby sweeping the varying amounts of charge received along a longitudinal extension of the linear time conversion element,
connecting a plurality of storage and accumulation units arranged in at least one row along the side of the time conversion element to the time conversion element at a plurality of discretely spaced sampling locations, and thereby collecting the amounts of charge between two adjacent sampling locations in one of the storage and accumulation units,
moving the charges accumulated in the storage and accumulation units to at least one electronic charge detection circuit for handling the charges accumulated in the storage and accumulation units.

13. A method of sampling charges according to claim 11, further comprising collecting the charges simultaneously in a plurality of storage and accumulation units.

14. The method of sampling charges according to claim 11, further comprising changing the electrical field between sampling the charges and moving the charges stored in the storage and accumulation units to the linear time conversion element.

15. A method of sampling charges according to claim 11, further comprising moving the charges stored in the storage and accumulation units in a temporally staggered manner to the linear time conversion element.

16. A method of producing a signal processing device, comprising the steps of:
providing a linear time conversion element having a first end and a second end,
providing an electrical field generator for producing a lateral electrical field in the time conversion element for sweeping charge along a longitudinal extension of the linear time conversion element,
arranging a plurality of storage and accumulation units in at least one row on at least one side of the linear time conversion element,
providing at least one connecting and disconnecting device for connecting and disconnecting the storage and accumulation units to the time conversion element at a plurality of discretely spaced sampling locations, and
providing at least one charge detection circuit electrically connectable to the storage and accumulation units for further detecting the charges stored in the storage and accumulation units.

* * * * *